(12) United States Patent
Sakai et al.

(10) Patent No.: US 7,436,212 B2
(45) Date of Patent: Oct. 14, 2008

(54) INTERFACE CIRCUIT POWER REDUCTION

(75) Inventors: Tatsuya Sakai, Kanagawa (JP);
Tsuyoshi Satoh, Kanagawa (JP);
Hiroshi Oshikawa, Kanagawa (JP);
Toru Aida, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 443 days.

(21) Appl. No.: 10/944,091

(22) Filed: Sep. 17, 2004

(65) Prior Publication Data

US 2005/0073198 A1   Apr. 7, 2005

(30) Foreign Application Priority Data

Sep. 17, 2003   (JP)   ............................. 2003-324135

(51) Int. Cl.
*H03K 19/0175* (2006.01)
*H03K 19/094* (2006.01)
*H03K 19/20* (2006.01)

(52) U.S. Cl. ............................. 326/81; 326/80; 326/86; 326/112; 326/119; 326/121

(58) Field of Classification Search ................... 326/86, 326/80, 81
See application file for complete search history.

(56) References Cited

U.S. PATENT DOCUMENTS

| | | | | |
|---|---|---|---|---|
| 4,567,575 A | * | 1/1986 | Morihisa et al. | 326/68 |
| 5,361,005 A | * | 11/1994 | Slattery et al. | 326/56 |
| 5,469,082 A | * | 11/1995 | Bullinger et al. | 326/81 |
| 5,546,021 A | * | 8/1996 | Bizuneh et al. | 326/86 |
| 5,661,417 A | * | 8/1997 | Kondoh | 326/87 |
| 5,717,343 A | * | 2/1998 | Kwong | 326/27 |
| 5,969,543 A | * | 10/1999 | Erickson et al. | 326/83 |
| 5,973,521 A | * | 10/1999 | Kim et al. | 327/112 |
| 6,118,302 A | * | 9/2000 | Turner et al. | 326/68 |
| 6,236,234 B1 | * | 5/2001 | Yagi | 326/80 |
| 6,313,671 B1 | * | 11/2001 | Le et al. | 327/112 |
| 6,366,130 B1 | * | 4/2002 | Podlesny et al. | 326/95 |
| 6,504,401 B1 | * | 1/2003 | Huang et al. | 326/81 |

(Continued)

FOREIGN PATENT DOCUMENTS

JP   2003-150287   2/2003

OTHER PUBLICATIONS

US 5,343,095, 08/1994, Shay (withdrawn)*

*Primary Examiner*—Rexford Barnie
*Assistant Examiner*—Matthew C Tabler
(74) *Attorney, Agent, or Firm*—Townsend and Townsend and Crew LLP; Rambod Nader (57) ABSTRACT

Embodiments of the invention provide an interface circuit that is capable of reducing the power consumption, which may be increased by a shoot-through current, and provide an electronic device having such an interface circuit. In one embodiment, an interface circuit exchanges signals with another electronic device via a signal transmission line. The interface circuit includes a switch for pulling up the signal transmission line and a switch for pulling down the signal transmission line. While a pull-up or pull-down is performed, the interface circuit detects the potential level of the signal transmission line to determine whether the signal transmission line is pulled down or pulled up by the other electronic device. If the signal transmission line is not pulled down/pulled up by the other electronic device, the interface circuit exercises pull-down/pull-up control.

15 Claims, 5 Drawing Sheets

U.S. PATENT DOCUMENTS

| | | | |
|---|---|---|---|
| 6,566,932 B2 * | 5/2003 | Yoon | 327/333 |
| 6,985,009 B2 * | 1/2006 | Nishio et al. | 326/30 |
| 2002/0036516 A1 * | 3/2002 | Petty | 326/80 |
| 2006/0044011 A1 * | 3/2006 | Andresen et al. | 326/63 |

* cited by examiner

INTERFACE CIRCUIT POWER REDUCTION

BACKGROUND OF THE INVENTION

The present invention relates to an interface circuit, and more particularly to an interface circuit for exchanging signals with another electronic device via a signal transmission line and an electronic device having such an interface circuit.

Figure 6:
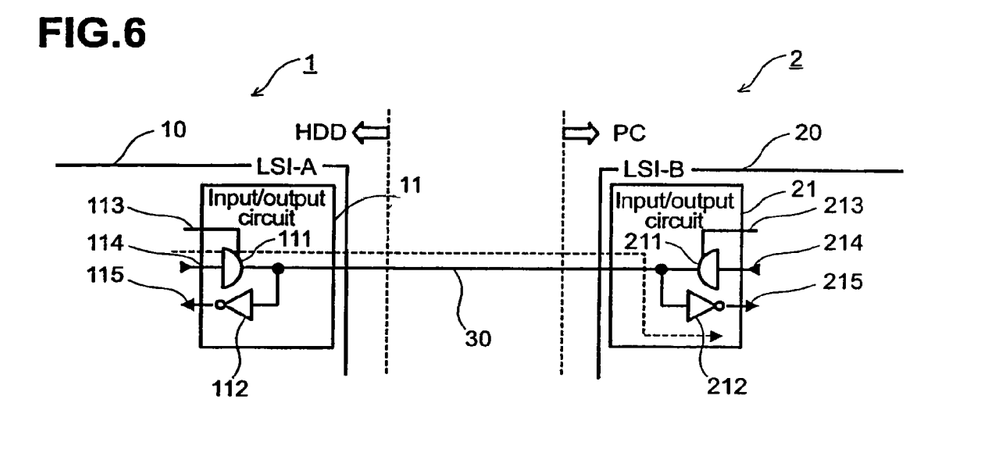
FIG. 6 is a diagram that illustrates a conventional bus structure.

For a signal exchange among a plurality of electronic devices, the electronic devices are conventionally interconnected via a bus. FIG. 6 illustrates a conventional bus structure. This figure shows the structure of a bus connection between a hard disk drive and a personal computer (host).

The hard disk drive and personal computer shown in FIG. 6 are connected via a signal bus line 30. LSI-A (Large Scale Integration-A) 10 is mounted in the hard disk drive, whereas LSI-B 20 is mounted in the personal computer.

LSI-A 10 is connected to the signal bus line 30 via a connector or the like (not shown). LSI-A 10 includes an input/output circuit 11. The input/output circuit 11 includes an output driver 111 and an input receiver 112. The output of the output driver 111 and the input of the input receiver 112 are electrically connected to the signal bus line 30. The output driver 111 is also connected to signal line 114 to which an output signal is entered, and signal line 113 to which an output enable signal is entered. Further, the input receiver 112 is also connected to signal line 115, which outputs an input signal. LSI-B 20 has the same structure as LSI-A 10. LSI-B 20 includes an input/output circuit 21. The input/output circuit 21 includes an output driver 211 and an input receiver 212. The output of the output driver 211 and the input of the input receiver 212 are electrically connected to the signal bus line 30. The output driver 211 is also connected to signal line 214 to which an output signal is entered and signal line 213 to which an output enable signal is entered. Further, the input receiver 212 is also connected to signal line 215, which outputs an input signal.

A case where LSI-A 10 transmits a signal to LSI-B 20 when the employed bus is structured as shown in FIG. 6 will now be described. When an output enable signal is entered into LSI-A 10 via signal line 113, the output driver 111 goes into an output state. If an output signal is entered via signal line 114 in this instance, the output driver 111 drives the signal bus line 30 so that the signal output from the output driver 111 is conveyed to LSI-B 20 as indicated by a broken line in FIG. 6. LSI-B 20 uses the input receiver 212 to receive this output signal and conveys the signal to an MPU (not shown) via signal line 215.

When LSI-B 20 transmits a signal to LSI-A 10, the output driver 211 of LSI-B 20 similarly conveys the signal to the input receiver 112 of LSI-A 10 via the signal bus line 30.

Figure 7:
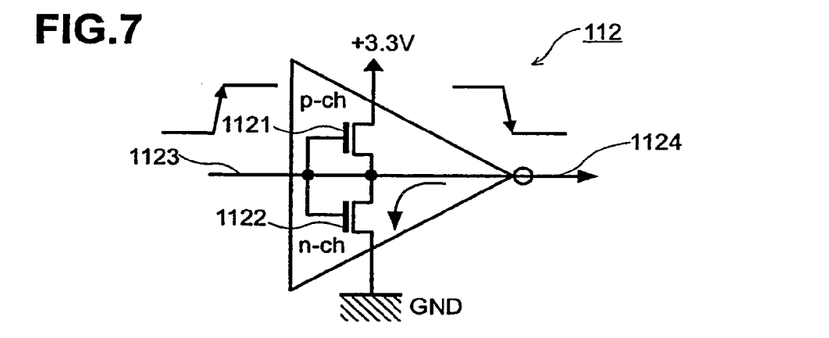
FIG. 7 is a diagram that illustrates how a general input receiver is structured and how the signal level changes.
Figure 8:
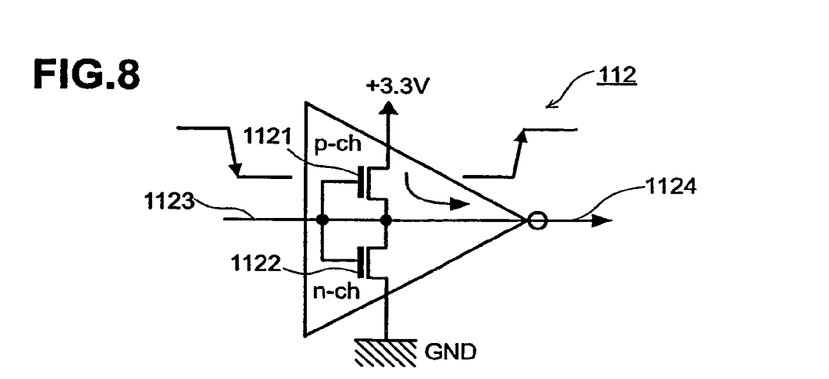
FIG. 8 is a diagram that illustrates how a general input receiver is structured and how the signal level changes.

The structures of the input receivers 112, 212 will now be described in detail with reference to FIGS. 7 and 8. In general, a CMOS (Complementary Metal Oxide Semiconductor) type transistor connection structure is employed for an LSI that constitutes the input receivers 112, 212. As indicated in FIGS. 7 and 8, input receiver 112 comprises a P-channel transistor 1121 and an N-channel transistor 1122, which are series-connected between a power supply potential (+3.3 V in an example shown) and a ground potential. An input signal line 1123, which is connected to the signal bus line 30, is connected to a gate of transistors 1121 and 1122. An output signal line 1124 is connected to a drain of transistors 1121 and 1122.

FIG. 7 illustrates a state where an input signal entered from signal line 1123, which is connected to the signal bus line 30, is changed from low to high. In this instance, the P-channel transistor 1121 changes from ON to OFF, the N-channel transistor 1122 changes from OFF to ON, and an output signal line 1124 changes from high to low.

On the contrary, FIG. 8 illustrates a state where an input signal entered from signal line 1123, which is connected to the signal bus line 30, is changed from high to low. In this instance, the P-channel transistor 1121 changes from OFF to ON, the N-channel transistor 1122 changes from ON to OFF, and the output signal line 1124 changes from low to high.

If the input signal transition is fast during a normal operation, either one of the two transistors 1121, 1122 is ON. Therefore, the shoot-through current, that is, the current that directly flows from the power supply potential to the ground, is virtually zero. This allows CMOS circuits to operate while consuming a minimum amount of power.

If the input signal transition is slow, on the other hand, a large shoot-through current arises because both transistors 1121, 1122 are ON for a certain period. Therefore, the CMOS circuits are generally prescribed so that a signal invoking a slow transition will not be applied.

However, if no data transfer is made within a bus structure shown in FIG. 6, the signal bus line 30 is generally placed in a high-impedance (Hi-Z) state in which no driver within an input/output circuit is driven. In such a high-impedance state, therefore, the potential of the signal bus line 30 is neither high nor low and is in an undefined state.

Figure 9:
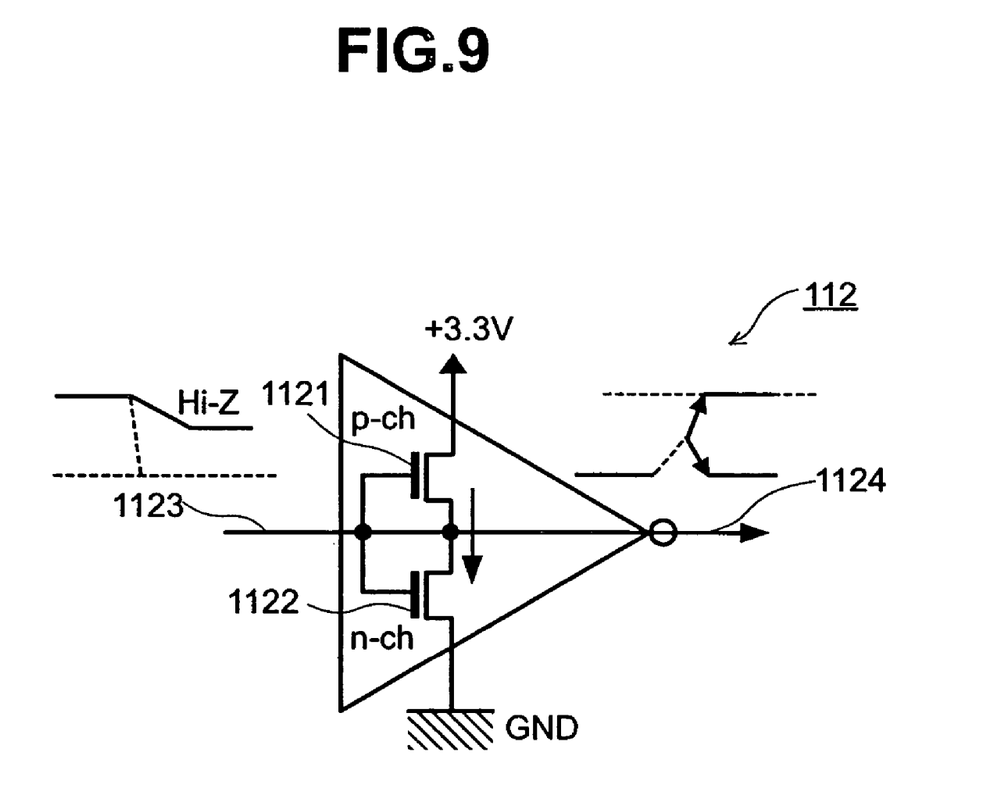
FIG. 9 is a diagram that illustrates how a general input receiver is structured and how the signal level changes.

FIG. 9 illustrates the input receiver status in the above-mentioned state. In the state described above, the potential of the signal bus line 30 is at an intermediate level. This causes both transistors 1121, 1122 to turn ON, allowing the shoot-through current to continuously flow. As a result, the power consumption increases.

To avoid a problem caused by the shoot-through current, the potential can be kept high by pulling up the signal bus line 30 (input signal line 1123) with a resistor or kept low by pulling down the signal bus line 30 (input signal line 1123) with a resistor.

However, if the output driver outputs a low signal during a normal circuit operation in situations where the above pull-up method is used, there arises a problem where a small amount of current is consumed via the resistor. Further, if the signal bus line is defined by the ATA, CF, or other public specification, the addition of a pull-up circuit may not always be permitted depending on specific product conditions.

If a remote device with which signals are exchanged is connected to a bus when it is used by a user, it is impossible to determine whether the remote device has pulled up or pulled down the signal bus line or placed it in a high-impedance state. Therefore, if the local device performs a pull-up while the remote device performs a pull-down, the intermediate potential always results when no driving force is exerted. As a result, the above-mentioned problem arises so that the power consumption is increased by the shoot-through current.

A solution to the shoot-through current problem described above is proposed by JP-A No. 150287/2003. If there is no bus access to a terminal to which an external device is connected for a predetermined period of time, the technology disclosed by JP-A No. 150287/2003 pulls up the terminal for the purpose of avoiding a shoot-through current while reducing the power consumption. However, the technology as disclosed does not check whether a remote device has pulled up or pulled down the signal bus line or placed it in a high-impedance state. Therefore, it cannot solve the problem in which the power consumption increases depending on the combination with the remote device control.

As described above, the problem in which a shoot-through current increases the power consumption during the use of a conventional interface circuit has not been successfully solved.

BRIEF SUMMARY OF THE INVENTION

Embodiments of the present invention provide an interface circuit that is capable of minimizing the power consumption, which may be increased by a shoot-through current, and provide an electronic device having such an interface circuit.

Embodiments of the present invention provide an interface circuit for exchanging signals with another electronic device via a signal transmission line. This interface circuit comprises a potential maintenance module for maintaining the signal transmission line at a specified potential in accordance with a control signal and a control module for judging whether the other electronic device is exercising control to maintain the signal transmission line at a specified potential, and generating, if it is judged that the other electronic device is not exercising control to maintain the signal transmission line at a specified potential, a control signal to maintain the signal transmission line at a specified potential. When the above configuration is employed, it is possible to avoid an increase in a shoot-through current, which arises if control is locally exercised to maintain a potential that is opposite to a potential maintained by another electronic device. Further, if the other electronic device is not exercising control to maintain a specified potential, the interface circuit exercises control to achieve the same purpose. As a result, a high-impedance state can be avoided while preventing an increase in the shoot-through current.

Preferably, the potential maintenance module should include a switch for keeping the signal transmission line either high or low. It is also preferable that the control module detect a potential level of the signal transmission line and judge whether the other electronic device is exercising control to maintain a specified potential. This ensures that the other electronic device's control can be automatically recognized.

The control module in a preferred embodiment detects chronological changes in the potential level of the signal transmission line when the potential of the signal transmission line changes and judges whether the other electronic device is exercising control to maintain a specified potential. The use of this configuration provides increased judgment accuracy.

More specifically, the control module alternately outputs a control signal for pull-up and a control signal for pull-down to the potential maintenance module, detects the potential level of the signal transmission line in a state where the potential maintenance module has performed a pull-up, canceled a pull-up, performed a pull-down, or canceled a pull-down in compliance with a control signal, and judges whether the other electronic device is exercising control to maintain a specified potential.

Further, it is preferable that the control module detect the potential level of the signal transmission line whenever a predetermined period of time elapses after a state transition, and that the predetermined period of time be shorter than the length of time required for a signal to switch to an undefined state after its state transition from high or low to a high-impedance state. It is also preferable that the predetermined period of time for the control module be longer than the length of time required for a signal to complete its state transition after the signal is pulled up or pulled down while it is high or low.

In a specific embodiment, it is concluded that the other electronic device is not exercising control to maintain a specified potential if a low state arises when the pull-down is performed, a low state arises when the pull-down is canceled, a high state arises when the pull-up is performed, and a high state arises when the pull-up is canceled.

An input receiver for entering a signal into the signal transmission line within the interface circuit is effective particularly when it has a CMOS transistor connection structure.

The electronic device according to one embodiment of the present invention, which exchanges signals with another electronic device via a signal transmission line, comprises a pull-up circuit for pulling up the signal transmission line in compliance with a control signal, a pull-down circuit for pulling down the signal transmission line in compliance with a control signal, and a processor for inputting a potential level signal according to the potential level of the signal transmission line and outputting the control signal to the pull-up circuit and pull-down circuit. The processor pulls up or pulls down the signal transmission line by outputting the control signal to the pull-up circuit or pull-down circuit, detects the potential level of the signal transmission line in a state where the pull-up is performed, the pull-up is canceled, the pull-down is performed, or the pull-down is canceled, judges whether the other electronic device is exercising pull-up control or pull-down control, and, if it is found that the other electronic device is not exercising pull-up control or pull-down control, outputs a control signal for performing either a pull-up or pull-down to the pull-up circuit or pull-down circuit from either the pull-up circuit or pull-down circuit. The use of the above configuration makes it possible to inhibit the shoot-through current.

The other electronic device according to an embodiment of the present invention, which exchanges signals with another electronic device via a signal transmission line, comprises a pull-up module for pulling up the signal transmission line in compliance with a control signal, a pull-down module for pulling down the signal transmission line in compliance with a control signal, and a control module for inputting a potential level signal according to the potential level of the signal transmission line and outputting the control signal to the pull-up module and pull-down module. The control module pulls up or pulls down the signal transmission line by outputting the control signal to the pull-up module or pull-down module, detects the potential level of the signal transmission line in a state where the pull-up is performed, the pull-up is canceled, the pull-down is performed, or the pull-down is canceled, judges whether the other electronic device is exercising pull-up control or pull-down control, and, if it is found that the other electronic device is not exercising pull-up control or pull-down control, outputs a control signal for performing either a pull-up or pull-down to the pull-up module or pull-down module from either the pull-up module or pull-down module.

The status detection circuit according to one embodiment of the present invention, which detects whether another electronic device connected via a signal transmission line is exercising control to maintain the signal transmission line at a specified potential, comprises a potential change module for varying the potential level of the signal transmission line in compliance with a control signal and a control module for outputting a control signal for varying the potential level of the signal transmission line to the potential change module, detecting chronological changes in the potential level of the signal transmission line when the potential of the signal transmission line is varied, and judging whether the other electronic device is exercising control to maintain a specified potential. The use of the above configuration makes it possible to accurately detect whether the other electronic device connected via the signal transmission line is exercising control to maintain a specified potential.

It is preferable that the control module alternately output a control signal for pull-up and a control signal for pull-down to the potential maintenance module, detect the potential level of the signal transmission line in a state where the potential maintenance module has performed a pull-up, canceled a pull-up, performed a pull-down, or canceled a pull-down in compliance with a control signal, and judge whether the other electronic device is exercising control to maintain the signal transmission line at a specified potential. The use of this configuration provides increased judgment accuracy.

The control module in a preferred embodiment detects the potential level of the signal transmission line whenever a predetermined period of time elapses after a state transition. The predetermined period of time is shorter than the length of time required for a signal to switch to an undefined state after its state transition from high or low to a high-impedance state, and longer than the length of time required for a signal to complete its state transition after the signal is pulled up or pulled down while it is high or low.

Preferably, it should also be concluded that the other electronic device is not exercising control to maintain the signal transmission line at a specified potential if a low state arises when the pull-down is performed, a low state arises when the pull-down is canceled, a high state arises when the pull-up is performed, or a high state arises when the pull-up is canceled.

Embodiments of the present invention provide an interface circuit that is capable of minimizing the power consumption, which may be increased by a shoot-through current, and provides an electronic device having such an interface circuit.

DETAILED DESCRIPTION OF THE INVENTION

Figure 1:
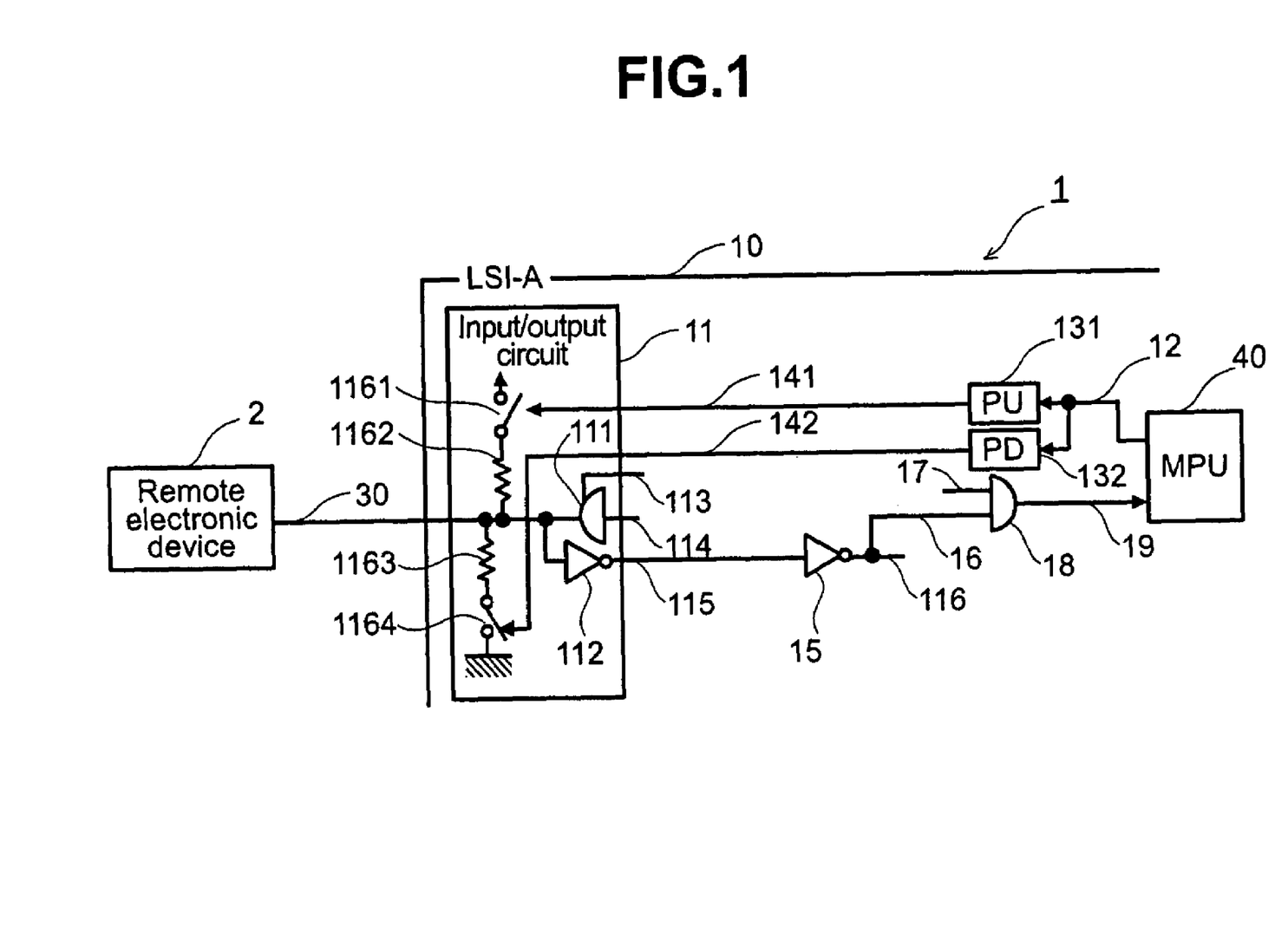
FIG. 1 is a diagram that illustrates the configuration of an interface circuit according to an embodiment of the present invention.

FIG. 1 illustrates the configuration of an interface circuit according to an exemplary embodiment of the present invention. The interface circuit also functions as a status detection circuit for detecting the status of a signal bus line, that is, detecting whether a pull-up or pull-down is performed by a remote electronic device. The interface circuit includes at least LSI-A 10 and an MPU (microprocessor unit) 40. In FIG. 1, LSI-A 10 for an electronic device 1 in which the interface circuit is mounted is connected to a remote electronic device 2 via a signal bus line 30. Electronic devices 1 and 2 share the same signal line on the signal bus line 30 for signal transmission/reception (input/output) to effect bidirectional communication. In an example shown in FIG. 1, 1:1 communication is indicated. However, 1 :n or n:n communication can be established as well. The remote electronic device 2 includes a component equivalent to LSI-B 20, which is shown in FIG. 6. However, it is impossible to determine whether the remote electronic device 2 is configured to pull up or pull down the signal bus line 30.

LSI-A 10 and an LSI including an input/output circuit mounted in the remote electronic device 2 both have a CMOS transistor connection structure as shown in FIG. 7. The signal bus line 30 is a signal transmission line, which usually comprises 10 to 40 signal lines.

LSI-A 10 includes an input/output circuit 11. The input/output circuit 11 includes an output driver 111 and an input receiver 112. The output driver 111 is a circuit on the driving side and used to output a signal to the signal bus line 30 from electronic device 10. The input receiver 112 receives a signal from the signal bus line 30 and conveys it to the MPU 40 or other internal circuit.

The output of the output driver 111 and the input of the input receiver 112 are electrically connected to the signal bus line 30. The output driver 111 is also connected to signal line 114 to which an output signal is entered from the MPU 40, and signal line 113 to which an output enable signal is entered from the MPU 40. Further, the input receiver 112 is also connected to signal line 115, which outputs an input signal. The input/output circuit 11 includes a pull-up resistor 1162 and a pull-down resistor 1163, which are connected to the signal bus line 30. The pull-up resistor 1162 is connected, for instance, to a 3.3 V power supply potential and a 5 V power supply potential via a switch 1161. The pull-down resistor 1163 is connected to a ground potential via a switch 1164. Switch 1161 and pull-up resistor 1162 compose a pull-up circuit. The pull-down resistor 1163 and switch 1164 compose a pull-down circuit. Further, switch 1161, pull-up resistor 1162, pull-down resistor 1163, and switch 1164 compose a potential maintenance circuit that keeps the signal bus line 30 at a specified potential in compliance with a control signal.

Switch 1161 is connected to a pull-up register 131 for digital value storage via signal line 141. Switch 1164 is connected to a pull-down register 132 for digital value storage via signal line 142. The pull-up register 131 and pull-down register 132 are connected to the MPU (microprocessor unit) 40 via signal line 12.

The output signal line 115 of the input receiver 112 in the input/output circuit 11 is connected to signal line 116, which enters a signal into the MPU 40 and other components via driver 15. This signal line 116 is branched and a branched signal line 16 is connected to an input terminal of driver 18. An input terminal 17 of driver 18 is connected to a signal line to which an MPU read enable signal is entered. The output terminal of driver 18 is connected to the MPU 40 via signal line 19.

In the interface circuit, which is configured as described above, the MPU 40 can write specified values into the pull-up register 131 and pull-down register 132. In accordance with the values of the connected pull-up register 131 and pull-down register 132, switches 1161 and 1164 alternate between ON and OFF, that is, between the conduction state and non-conduction state. If, for instance, the MPU 40 sets the value "1" in the pull-up register 131, switch 1161 turns ON so that the signal bus line 30 is connected to the power supply potential via pull-up resistor 1162. More specifically, the signal bus line 30 is pulled up to a potential that is dictated by the power supply potential and pull-up resistor 1162. In the above example, when the value "1" is set in pull-up register 131, switch 1161 turns ON. However, any predetermined value may be set in pull-up register 131. Switch 1161 may be set to turn ON when the value "0" is set.

The interface circuit is configured so as to permit the MPU 40 to read the potential level of an input signal that is output from an input receiver 115 via driver 15, signal line 16, driver 18, and signal line 19. Driver 18 is provided with an input terminal 17 for receiving a read enable signal from the MPU 40. When the MPU 40 reads the potential level of an input signal, the read enable signal is entered from the input terminal 17 of driver 18.

When the MPU 40 controls the pull-up switch 1161 or pull-down switch 1164 in the interface circuit shown in FIG. 1 to pull-up or pull-down the signal bus line 30 and detect the potential level input from input receiver 112 in the current state, the MPU 40 determines whether a pull-up or pull-down is performed by the remote electronic device 2 or an intermediate potential level is prevalent as neither a pull-up nor a pull-down is performed. In other words, the MPU 40 determines whether the signal bus line 30 is pulled up or pulled down or placed at a potential level that is intermediate between pull-up and pull-down. If it is found that the signal bus line 30 is at an intermediate potential level, the pull-up switch 1161 or pull-down switch 1164 is turned ON to pull up or pull down the signal bus line 30.

To explain about the reason for performing the above process, the signal bus line signal level changes invoked by pull-up and pull-down will be first described with reference to FIGS. 2, 3, and 4. In each figure, "Hi" denotes a potential level prevalent in a high state; "Th," a potential level representing a logical threshold value; and "Lo," a potential level prevalent in a low state.

Figure 2:
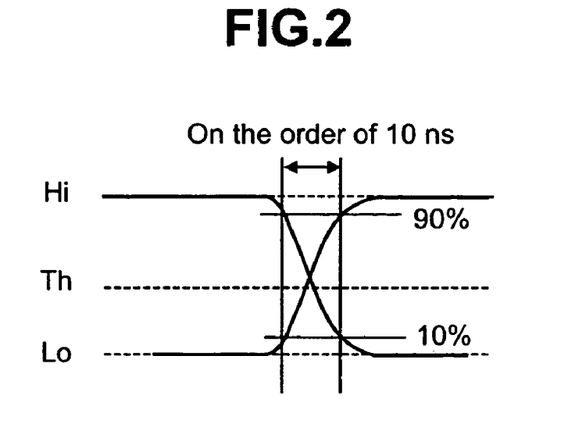
FIG. 2 is a diagram that illustrates the signal level transition of a signal bus line.

FIG. 2 shows cases where a signal output from output driver 111 changes from a high state to a low state and from a low state to a high state. As indicated in FIG. 2, the time required for a low-to-high potential level change from 10% of the high level to 90% is generally on the order of 10 ns (nanoseconds). Similarly, the time required for a high-to-low potential level change from 90% of the high level to 10% is generally on the order of 10 ns (nanoseconds) as well.

Figure 3:
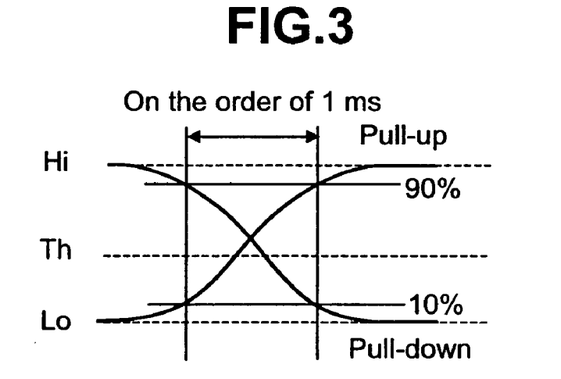
FIG. 3 is a diagram that illustrates the signal level transition of a signal bus line.

FIG. 3 shows cases where the signal bus line 30 is pulled up and pulled down. The time required for a potential level change upon a pull-up from 10% of the high level to 90% is generally on the order of 1 ms (milliseconds). The time required for a potential level change upon a pull-down from 90% of the high level to 10% is generally on the order of 1 ms (milliseconds) as well.

Figure 4:
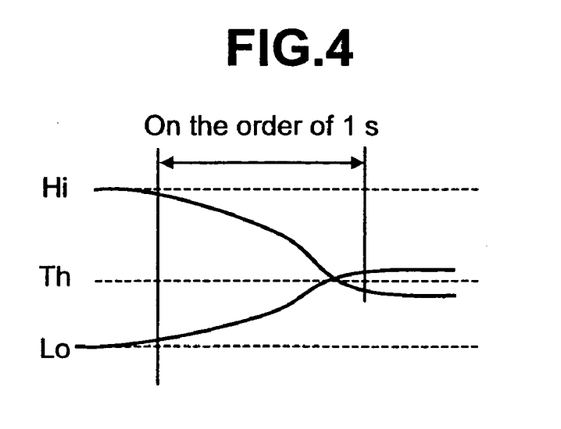
FIG. 4 is a diagram that illustrates the signal level transition of a signal bus line.

FIG. 4 shows cases where the signal output from output driver 111 changes from a high state to a high-impedance state in which no signal transfer takes place and changes from a low state to a high-impedance state in which no signal transfer takes place. When a signal line connected to output driver 111 changes from a high state to a high-impedance state, the transition from the high state to an undefined high-impedance state is invoked by a small amount of leak current. Therefore, the time required for such a transition is generally on the order of 1 s (second). When a signal output from output driver 111 changes from a low state to a high-impedance state, the time required for the transition from the low state to the high-impedance state is generally on the order of 1 s (second) as well.

The times required for signal level changes indicated in FIGS. 2, 3, and 4 differ depending, for instance, on the driver characteristics. However, it is true that the required level change times indicated in FIGS. 2, 3, and 4 are in order from the shortest to the longest.

The signal bus line status can be detected by making use of the above-mentioned differences in the signal level change time. There are five different signal bus line states. In the first state, a high signal is output from the remote electronic device 2, that is, a high state exists due to drive. This state is represented by the symbol "DH". In the second state, a low signal is outputted from the remote electronic device 2, that is, a low state exists due to drive. This state is represented by the symbol "DL". In the third state, the signal bus line is pulled up by the remote electronic device 2. This state is represented by the symbol "PU". In the fourth state, the signal bus line is pulled down by the remote electronic device 2. This state is represented by the symbol "PD". In the fifth state, the signal bus line is neither pulled up nor pulled down by the remote electronic device 2 and is placed in a high-impedance state. This state is represented by the symbol "HZ".

The determination flow for signal bus line status detection will now be described in detail with reference to a flowchart shown in FIG. 5. The determination process for signal bus line status detection is performed when, for instance, electronic device 1 is turned ON or the electronic devices are interconnected with the signal bus line 30. The determination process is generally performed by a control program for the MPU 40.

First of all, the MPU 40 pulls down the signal bus line 30. After 5 ms, the MPU 40 determines the signal level (step S101). More specifically, the MPU 40 sets the value "1" in the pull-down register 132. In response to this value setup, the pull-down switch 1164 turns ON to pull down the signal bus line 30. The MPU 40 supplies an MPU read enable signal to driver 18 and detects the potential level of signal line 19 to detect the signal level of the signal bus line 30.

If the result of signal level determination (step S101) indicates that the potential level of the signal bus line 30 is high, the MPU 40 concludes that the "DH" or "PU" state is prevalent. In the "DH" state in which a high signal is output from the remote electronic device 2, a pull-down is defeated by the high signal output even if the pull-down is performed by electronic device 1 so that the signal level of the signal bus line 30 is finalized as a high signal level on the order of 10 nm, as shown in FIG. 2. Therefore, if the signal level is determined 5 ms later, the signal level of the signal bus line 30 is already finalized as a high signal level. If electronic device 1 pulls down the signal bus line 30 in the "PU" state in which a pull-up is performed by the remote electronic device 2, the signal level of the signal bus line 30 may be either high or low in 5 ms depending, for instance, on the pull-up resistor and pull-down resistor resistance values. When the result of signal level determination (step S101) indicates that the signal bus line 30 is high as described above, it is concluded that at least the signal bus line 30 is not in the "HZ" state. Therefore, the MPU 40 of electronic device 1 terminates the process without pulling up or pulling down the signal bus line 30.

If, on the other hand, the result of signal level determination (step S101) indicates a low state, the MPU 40 concludes that the "DL," "PU," "PD," or "HZ" state is prevalent. If electronic device 1 performs a pull-down in the "DL" state where a low signal is output from the remote electronic device 2 or in the "PD" state where a pull-down is performed by the remote electronic device 2, it is obvious that the signal level of the signal bus line 30 is low. If electronic device 1 performs a pull-down in the "PU" state where a pull-up is performed by the remote electronic device 2, the signal level of the signal bus line 30 may be either high or low in 5 ms as described above. If electronic device 1 pulls down the signal bus line 30 in a high-impedance state, the signal bus line 30 is finalized at a low signal level in 5 ms because a pull-down is performed from an intermediate potential level.

Next, the MPU 40 turns off the pull-down. After 5 ms, the MPU 40 determines the signal level (step S102). More specifically, the MPU 40 sets the value "0" in the pull-down register 132. In response to this value setup, the pull-down switch 1164 turns OFF so that the signal bus line 30 exits a pulled-down state.

If the result of signal level determination (step S102) indicates a high state, the MPU 40 concludes that the "PU" state is prevalent. The reason is that, in a state where a pull-down is canceled by electronic device 1, the signal bus line 30 goes high in 5 ms only when a pull-up is performed by the remote electronic device 2. Only the states where the signal level of the signal bus line 30 is found to be low in signal level determination step S101 (DL, DU, PD, and HZ) are targeted for signal level determination in step S102. It should be noted that the "DH" state is excluded. If the result of signal level determination in step S102 indicates a high state, it is concluded that the prevalent state is other than HZ. Therefore, the process terminates without allowing electronic device 1 to pull up or pull down the signal bus line 30.

If, on the other hand, the result of signal level determination in step S102 indicates a low state, the MPU 40 concludes that the "DL," "PD," or "HZ" state is prevalent. If electronic device 1 cancels a pull-down in the "DL" or "PD" state, it is obvious that the signal level of the signal bus line 30 is low. If electronic device 1 cancels a pull-down in the "HZ" state, it is conceivable that the signal level of the signal bus line 30 may be either low or high in 1 s. In no more than 5 ms, however, the signal bus line 30 remains low because it cannot switch from a low state to a high state.

Next, the MPU 40 turns ON the pull-up. After 5 ms, the MPU 40 determines the signal level (step S103). More specifically, the MPU 40 sets the value "1" in the pull-up register 131. In response to this value setup, the pull-up switch 1161 turns ON to pull up the signal bus line 30.

If the result of signal level determination (step S103) indicates that the signal level of the signal bus line 30 is low, the MPU 40 concludes that the "DL" or "PD" state is prevalent. Even if a pull-up is performed in the "DL" state, it is defeated by a low signal output from the remote electronic device 2 so that finalization takes place on the order of 10 ns. Therefore, the signal bus line 30 goes low. If a pull-up is performed in the "PD" state, on the other hand, the signal level of the signal bus line 30 may be either high or low on the order of 1 ms. Therefore, either a high state or low state may arise in 5 ms. If the result of signal level determination (step S103) indicates a low state as described above, it is concluded that the prevalent state is other than HZ. Therefore, the process terminates without allowing electronic device 1 to pull up or pull down the signal bus line 30.

If, on the other hand, the result of signal level determination (step S1103) indicates that the signal level of the signal bus line 30 is high, the MPU 40 concludes that the "PD" or "HZ" state is prevalent. If a pull-up is performed in the "PD" state, the signal level of the signal bus line 30 may be either high or low as described above. On the other hand, if a pull-up is performed in the "HZ" state, the signal level of the signal bus line 30 is high.

Next, the MPU 40 turns OFF the pull-up. After 5 ms, the MPU 40 determines the signal level (step S104). More specifically, the MPU 40 sets the value "0" in the pull-up register 131. In response to this value setup, the pull-up switch 1161 turns OFF so that the signal bus line 30 exits a pulled-up state.

If the result of signal level determination (step S104) indicates a low state, the MPU 40 concludes that the "PD" state is prevalent. If a pull-down is performed by the remote electronic device 2, it can be concluded that the signal level of the signal bus line 30 is low on the order of 1 ms after a pull-up is canceled by electronic device 1. If the result of signal level determination (step S104) indicates that the signal level of the signal bus line 30 is low as described above, it is concluded that the prevalent state is other than HZ. Therefore, the process terminates without allowing electronic device 1 to pull up or pull down the signal bus line 30.

If, on the other hand, the result of signal level determination (step S104) indicates a high state, the MPU 40 concludes that the "HZ" state is prevalent. If the time on the order of 1 s elapses after a pull-up is canceled by electronic device 1, the signal bus line 30 may go low even when the remote electronic device 2 is in the "HZ" state. In 5 ms, however, the state prevailing before the pull-up is canceled, that is, a high state is prevalent as indicated in FIG. 4 so that the level remains unchanged.

When it is concluded that the "HZ" state is prevalent, the MPU 40 pulls up the signal bus line 30. More specifically, the MPU 40 sets the value "1" in the pull-up register 131. In response to this value setup, the pull-up switch 1161 turns ON to pull up the signal bus line 30. Alternatively, the signal bus line 30 may be pulled down instead of being pulled up in order to maintain a specified potential.

As described above, electronic device 1 pulls up or pulls down the signal bus line 30 to prevent it from being placed at an intermediate potential level only when it is judged that a high-impedance state is prevalent as the remote electronic device 2 has not outputted a high signal or low signal to the signal bus line 30 and not performed a pull-up or pull-down. Therefore, the shoot-through current can be properly reduced. More specifically, electronic device 1 performs a pull-up while a pull-down is performed by the remote electronic device 2 or performs a pull-down while a pull-up is performed by the remote electronic device 2, making it possible to prevent the shoot-through current from being generated with the signal bus line 30 placed at an intermediate potential level.

If, during the above determination processing steps, the signal bus line 30 is found to be low in signal level judgment step S101, which is performed 5 ms after initial pull-down turn-ON, found to be low in signal level judgment step S102, which is performed 5 ms after subsequent pull-down turn-OFF, found to be high in signal level judgment step S103, which is performed 5 ms after subsequent pull-up turn-ON, and found to be high in signal level judgment step S104, which is performed 5 ms after final pull-up turn-OFF, the MPU 40 eventually concludes that the "HZ" state, that is, a high-impedance state, is prevalent.

Figure 5:
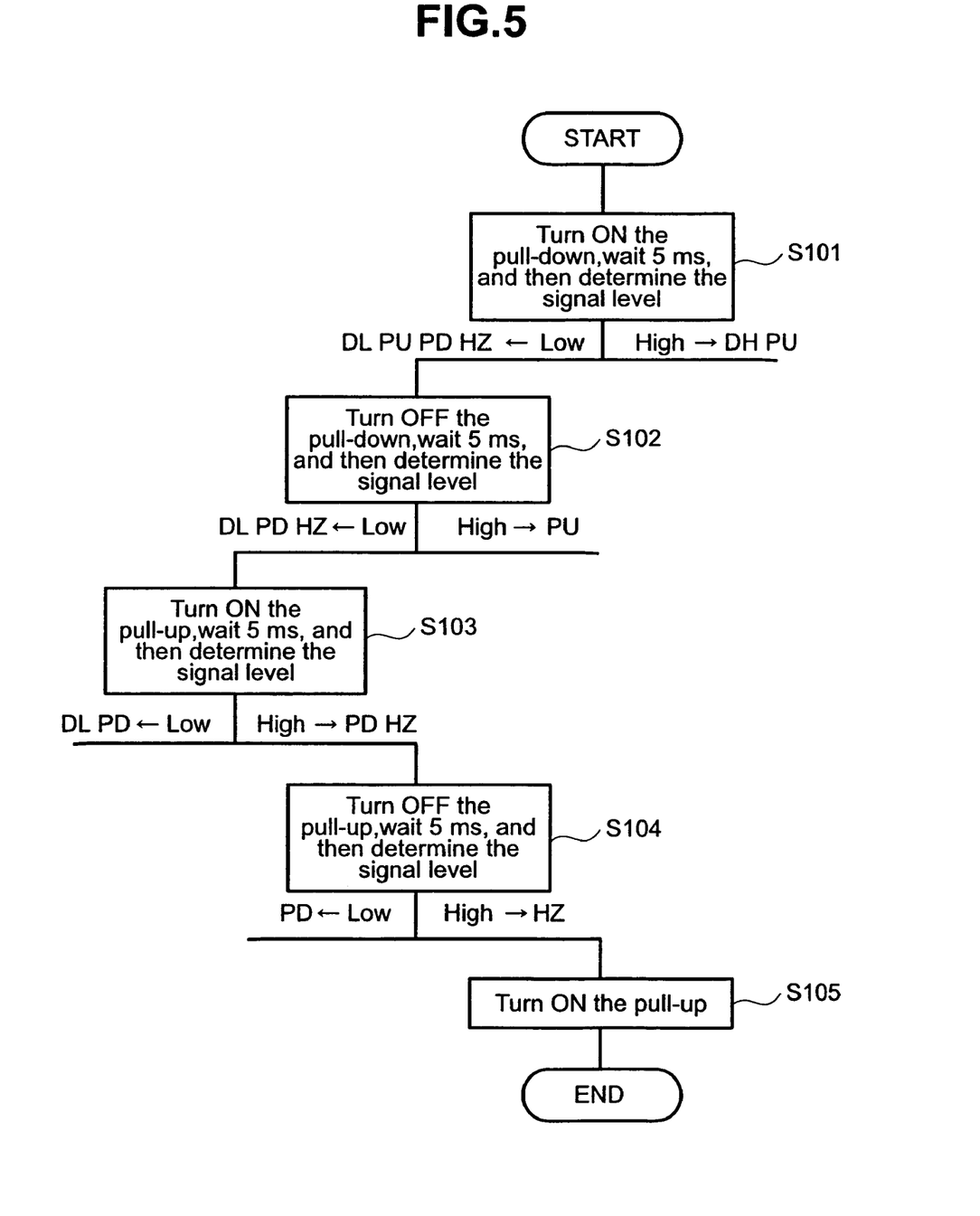
FIG. 5 is a flowchart illustrating a process that is performed by an interface circuit according to an embodiment of the present invention.

Alternatively, level judgment steps S103 and S104, which are indicated in a flowchart in FIG. 5, may be performed before level judgment steps S101 and S102. If, in this instance, the signal bus line 30 is found to be high in signal level judgment step S103, which is performed 5 ms after pull-up turn-ON, found to be high in signal level judgment step S104, which is performed 5 ms after subsequent pull-up turn-OFF, found to be low in signal level judgment step S101, which is performed 5 ms after subsequent pull-down turn-ON, and found to be low in signal level judgment step S102, which is performed 5 ms after final pull-down turn-OFF, the MPU 40 eventually concludes that the "HZ" state, that is, a high-impedance state, is prevalent.

In the above example, the signal level is detected with a delay of 5 ms after a specified time. However, an alternative delay time may be employed as long as it is shorter than the time required for the completion of a signal transition from a high or low state to a high-impedance state and longer than the time required for the completion of a signal transition in situations where a pull-up or pull-down is performed in a high or low state.

In the above example, the potential level of the signal bus line is detected to judge whether a pull-down or pull-up is performed by the remote electronic device. However, if a specification is defined, for situations where electronic devices are interconnected, so as to receive from a remote electronic device the information indicating whether either a pull-up or pull-down is performed or neither of them is performed, the judgment can be formulated by noting such information.

If electronic devices configured as shown in FIG. 1 are interconnected, it is desirable that the signal bus line be detected in accordance with the flowchart shown in FIG. 5, and that the same detection operation be performed again with a predetermined delay from the previous detection. The use of a random number for delay value determination particularly reduces the possibility of causing the electronic devices to simultaneously perform the same detection operation.

In the above example, a hard disk drive and a personal computer are indicated as electronic devices 1 and 2. Alternatively, however, various other electronic devices, including a CD-ROM drive, DVD drive, memory card, and other storage devices, audio devices, mobile terminals, and cellular phones may be used as electronic devices 1 and 2. In one preferred embodiment electronic devices 1 and 2 are mobile electronic devices that are required to minimize their power consumption.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. An interface circuit for exchanging signals with another electronic device via a signal transmission line, the interface circuit comprising:
a potential maintenance module configured to maintain said signal transmission line at a specified potential in accordance with a control signal; and
a control module configured to:
judge whether the other electronic device is exercising control to maintain said signal transmission line at a specified potential, and
generate, if it is judged that the other electronic device is not exercising control to maintain said signal transmission line at a specified potential, a control signal to maintain said signal transmission line at a specified potential,
wherein said control module detects chronological changes in the signal transmission line potential level when the potential of said signal transmission line is varied, and judges whether the other electronic device is exercising control to maintain said signal transmission line at a specified potential.

2. The interface circuit according to claim 1, wherein said potential maintenance module includes a plurality of switches to choose whether said signal transmission line is to be kept high or low.

3. The interface circuit according to claim 1, wherein said control module detects the potential level of said signal transmission line and judges whether the other electronic device is exercising control to maintain said signal transmission line at a specified potential.

4. An interface circuit for exchanging signals with another electronic device via a signal transmission line, the interface circuit comprising:
a potential maintenance module configured to maintain said signal transmission line at a specified potential in accordance with a control signal; and
a control module configured to:
judge whether the other electronic device is exercising control to maintain said signal transmission line at a specified potential, and
generate, if it is judged that the other electronic device is not exercising control to maintain said signal transmission line at a specified potential, a control signal to maintain said signal transmission line at a specified potential,
wherein said control module alternately outputs a control signal for pull-up and a control signal for pull-down to said potential maintenance module, detects the potential level of said signal transmission line in a state where said potential maintenance module has performed a pull-up, canceled a pull-up, performed a pull-down, or canceled a pull-down in compliance with a control signal, and judges whether the other electronic device is exercising control to maintain a specified potential.

5. The interface circuit according to claim 4, wherein said control module detects the potential level of said signal transmission line whenever a predetermined period of time elapses after a state transition, and wherein the predetermined period of time is shorter than the length of time required for a signal to switch to an undefined state after the signal's state transition from high or low to a high-impedance state.

6. The interface circuit according to claim 5, wherein the predetermined period of time for said control module is longer than the length of time required for a signal to complete the signal's state transition after the signal is pulled up or pulled down while the signal is high or low.

7. The interface circuit according to claim 4, 5, or 6, wherein said control module concludes that the other electronic device is not exercising control to maintain a specified potential if a low state arises when said pull-down is performed, a low state arises when said pull-down is canceled, a high state arises when said pull-up is performed, and a high state arises when said pull-up is canceled.

8. The interface circuit according to claim 2, 3, 1, 4, 5, 6, or 7, further comprising an input receiver for entering a signal from said signal transmission line within said interface circuit, the input receiver having a CMOS transistor connection structure.

9. An electronic device for exchanging signals with another electronic device via a signal transmission line, the electronic device comprising:
a pull-up circuit configured to pull up said signal transmission line in compliance with a control signal;
a pull-down circuit configured to pull down said signal transmission line in compliance with a control signal; and
a processor configured to input a potential level signal according to the potential level of said signal transmission line and output said control signal to said pull-up circuit and said pull-down circuit,
wherein said processor pulls up or pulls down the signal transmission line by outputting said control signal to said pull-up circuit or said pull-down circuit; detects the potential level of said signal transmission line in a state where the pull-up is performed, the pull-up is canceled, the pull-down is performed, or the pull-down is canceled; judges whether the other electronic device is exercising pull-up control or pull-down control; and, if it is found that the other electronic device is not exercising pull-up control or pull-down control, outputs a control signal for performing either a pull-up or pull-down to said pull-up circuit or pull-down circuit from either the pull-up circuit or pull-down circuit.

10. The electronic device of claim 9 wherein the processor is a microprocessor unit of the electronic device.

11. An electronic device for exchanging signals with another electronic device via a signal transmission line, the electronic device comprising:
   pull-up means for pulling up said signal transmission line in compliance with a control signal;
   pull-down means for pulling down said signal transmission line in compliance with a control signal; and
   control means for inputting a potential level signal according to the potential level of said signal transmission line and outputting said control signal to said pull-up means and said pull-down means,
   wherein said control means pulls up or pulls down the signal transmission line by outputting said control signal to said pull-up means or said pull-down means; detects the potential level of said signal transmission line in a state where the pull-up is performed, the pull-up is canceled, the pull-down is performed, or the pull-down is canceled; judges whether the other electronic device is exercising pull-up control or pull-down control; and, if it is found that the other electronic device is not exercising pull-up control or pull-down control, outputs a control signal for performing either a pull-up or pull-down to said pull-up means or pull-down means from either the pull-up means or pull-down means.

12. A status detection circuit for detecting whether another electronic device connected via a signal transmission line is exercising control to maintain the signal transmission line at a specified potential, the status detection circuit comprising:
   a potential change module configured to vary the potential level of said signal transmission line in compliance with a control signal; and
   a control module configured to output a control signal for varying the potential level of said signal transmission line to said potential change means, detect chronological changes in the potential level of said signal transmission line when the potential of the signal transmission line is varied, and judge whether the other electronic device is exercising control to maintain a specified potential.

13. The status detection circuit according to claim 12, wherein said control module alternately outputs a control signal for pull-up and a control signal for pull-down to said potential maintenance module, detects the potential level of said signal transmission line in a state where said potential maintenance module has performed a pull-up, canceled a pull-up, performed a pull-down, or canceled a pull-down in compliance with a control signal, and judges whether the other electronic device is exercising control to maintain said signal transmission line at a specified potential.

14. The status detection circuit according to claim 13, wherein said control module detects the potential level of said signal transmission line whenever a predetermined period of time elapses after a state transition, and wherein the predetermined period of time is shorter than the length of time required for a signal to switch to an undefined state after the signal's state transition from high or low to a high-impedance state and longer than the length of time required for a signal to complete the signal's state transition after the signal is pulled up or pulled down while the signal is high or low.

15. The status detection circuit according to claim 13 or 14, wherein said control module concludes that the other electronic device is not exercising control to maintain said signal transmission line at a specified potential if a low state arises when said pull-down is performed, a low state arises when said pull-down is canceled, a high state arises when said pull-up is performed, and a high state arises when said pull-up is canceled.

* * * * *